(12) United States Patent
Tan et al.

(10) Patent No.: US 11,864,336 B2
(45) Date of Patent: Jan. 2, 2024

(54) CASING ASSEMBLY AND ELECTRONIC DEVICE INCLUDING THE SAME

(71) Applicant: WISTRON CORP., New Taipei (TW)

(72) Inventors: Siyun Tan, New Taipei (TW); Jiacheng Chen, New Taipei (TW)

(73) Assignee: WISTRON CORP., New Taipei (TW)

( * ) Notice: Subject to any disclaimer, the term of this patent is extended or adjusted under 35 U.S.C. 154(b) by 0 days.

(21) Appl. No.: 17/820,262

(22) Filed: Aug. 17, 2022

(65) Prior Publication Data
US 2023/0328908 A1    Oct. 12, 2023

(30) Foreign Application Priority Data

Apr. 12, 2022 (CN) .......................... 202210379426.7

(51) Int. Cl.
*H05K 5/02* (2006.01)
*H05K 7/14* (2006.01)

(52) U.S. Cl.
CPC ........... *H05K 5/023* (2013.01); *H05K 7/1489* (2013.01)

(58) Field of Classification Search
CPC .... H05K 5/023; H05K 7/1489; H05K 5/0221; H05K 7/1487; H05K 7/1488; G06F 1/184; G06F 1/185; G06F 1/186; G06F 1/187
See application file for complete search history.

(56) References Cited

U.S. PATENT DOCUMENTS

| | | | |
|---|---|---|---|
| 9,674,978 B2 * | 6/2017 | Wu | G06F 1/185 |
| 9,826,658 B1 | 11/2017 | Mao et al. | |
| 10,251,300 B1 * | 4/2019 | Mao | H05K 7/1487 |
| 10,863,644 B1 * | 12/2020 | Tseng | H05K 7/1487 |
| 11,026,342 B2 * | 6/2021 | Huang | H05K 7/1489 |
| 11,197,387 B2 | 12/2021 | Liu et al. | |
| 11,310,932 B2 * | 4/2022 | Chang | H05K 7/16 |
| 11,683,904 B2 * | 6/2023 | Chang | H05K 7/1489 |
| | | | 361/679.02 |

FOREIGN PATENT DOCUMENTS

TW   201808083 A   3/2018
TW   202046845 A   12/2020

OTHER PUBLICATIONS

TW Office Action dated Mar. 7, 2023 in Taiwan application No. 111118457.

* cited by examiner

*Primary Examiner* — James Wu
*Assistant Examiner* — Christopher L Augustin
(74) *Attorney, Agent, or Firm* — McClure, Qualey & Rodack, LLP

(57) ABSTRACT

A casing assembly includes a carrier, a pivotable component, and a handle, where the carrier has a positioning slot with a fixing end, the pivotable component is pivotably disposed on the carrier, the handle is movably disposed on the pivotable component and pivotably connected to the carrier via the pivotable component, the handle has an engagement element selectively inserted into the positioning slot and engaged with the fixing end.

20 Claims, 15 Drawing Sheets

CASING ASSEMBLY AND ELECTRONIC DEVICE INCLUDING THE SAME

CROSS-REFERENCE TO RELATED APPLICATIONS

This non-provisional application claims priority under 35 U.S.C. § 119(a) on Patent Application No(s). 202210379426.7 filed in China on Apr. 12, 2022, the entire contents of which are hereby incorporated by reference.

TECHNICAL FIELD

The disclosure relates to a casing structure, more particularly related to a casing assembly and an electronic device including the same.

BACKGROUND

A computer or server rack may contain one or more detachable carriers for optimizing the utilization of the internal space of a chassis thereof. Taking a tray that is suitable to be stacked on a server chassis as an example, the tray is detachable and served to support or accommodate circuit boards and other associated devices or modules, such that chosen devices or modules are allowed to be efficiently and quickly placed to the upper area of the chassis.

In most case, the tray has a handle for user to carry the tray, and the handle is movable so that it can be stored when not in use and can be opened when the user needs to move the tray. However, in the conventional trays, the handle tends to swing relative to the tray while the user holding it. This problem will become severe when the tray carries more devices or modules. To reduce the swinging of the tray relative to the handle, some conventional trays have one or more bumps on the surface of the tray or the handle to increase the friction between the handle and the tray, but the bumps are not effective and easily wear and scratch the surface of the tray and the handle and thereby resulting in damage and rust.

SUMMARY

Accordingly, one aspect of the disclosure is to provide a casing assembly and an electronic device including the same which are capable of preventing carrier from swinging relative to the handle while user holding the handle.

One embodiment of the disclosure provides a casing assembly including a carrier, a pivotable component, and a handle, where the carrier has a positioning slot with a fixing end, the pivotable component is pivotably disposed on the carrier, the handle is movably disposed on the pivotable component and pivotably connected to the carrier via the pivotable component, the handle has an engagement element selectively inserted into the positioning slot and engaged with the fixing end.

One embodiment of the disclosure provides an electronic device including a chassis and a casing assembly, where the casing assembly includes a carrier, a pivotable component, and a handle, the carrier is removably disposed on the chassis and has a positioning slot with a fixing end, the pivotable component is pivotably disposed on the carrier, the handle is movably disposed on the pivotable component and pivotably connected to the carrier via the pivotable component, the handle has an engagement element selectively inserted into the positioning slot and engaged with the fixing end.

According to the casing assembly and the electronic device as discussed in the above embodiments of the disclosure, the handle is rotatable about the pivotable component which is displaced from the fixing end of the positioning slot on the carrier, and the engagement element on the handle is removably located in the positioning slot, thus, when the engagement element of the handle is in the positioning slot, the positioning slot is able to effectively prevent the handle from rotating and therefore prevents the carrier from swinging relative to the handle while user holding the handle.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

Aspects and advantages of the disclosure will become apparent from the following detailed descriptions with the accompanying drawings. The inclusion of such details provides a thorough understanding of the disclosure sufficient to enable one skilled in the art to practice the described embodiments but it is for the purpose of illustration only and should not be understood to limit the disclosure. On the contrary, it is intended to cover alternatives, modifications, and equivalents as can be included within the spirit and scope of the described embodiments as defined by the appended claims. To this end, those skilled in the relevant art will recognize and appreciate that many changes can be made to the various aspects of the disclosure described herein, while still obtaining the beneficial results of the present disclosure. It will also be apparent that some of the desired benefits of the present disclosure can be obtained by selecting some of the features of the present disclosure without utilizing other features.

It is to be understood that the phraseology and terminology used herein are for the purpose of better understanding the descriptions and should not be regarded as limiting. Unless specified or limited otherwise, the terms "mounted," "connected," and variations thereof are used broadly and encompass both direct and indirect mountings and connections. As used herein, the terms "substantially" or "approximately" may describe a slight deviation from a target value, in particular a deviation within the production accuracy and/or within the necessary accuracy, so that an effect as present with the target value is maintained. Unless specified or limited otherwise, the phrase "at least one" as used herein may mean that the quantity of the described element or component is one or more than one but does not necessarily mean that the quantity is only one. The term "and/or" may be used herein to indicate that either or both of two stated possibilities.

Figure 1:
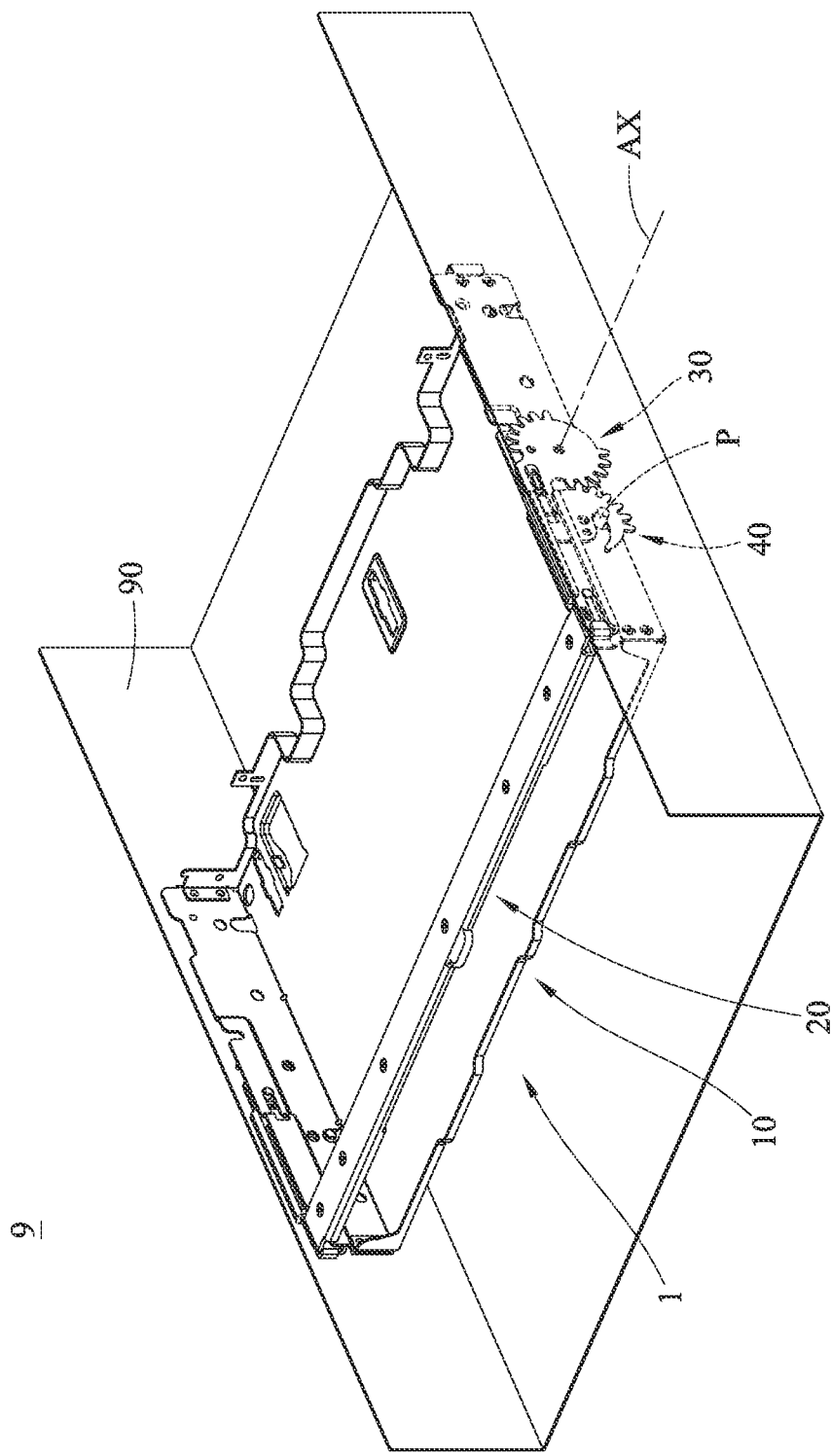
FIG. 1 is a perspective view of an electronic device according to one embodiment of the disclosure.
Figure 2:
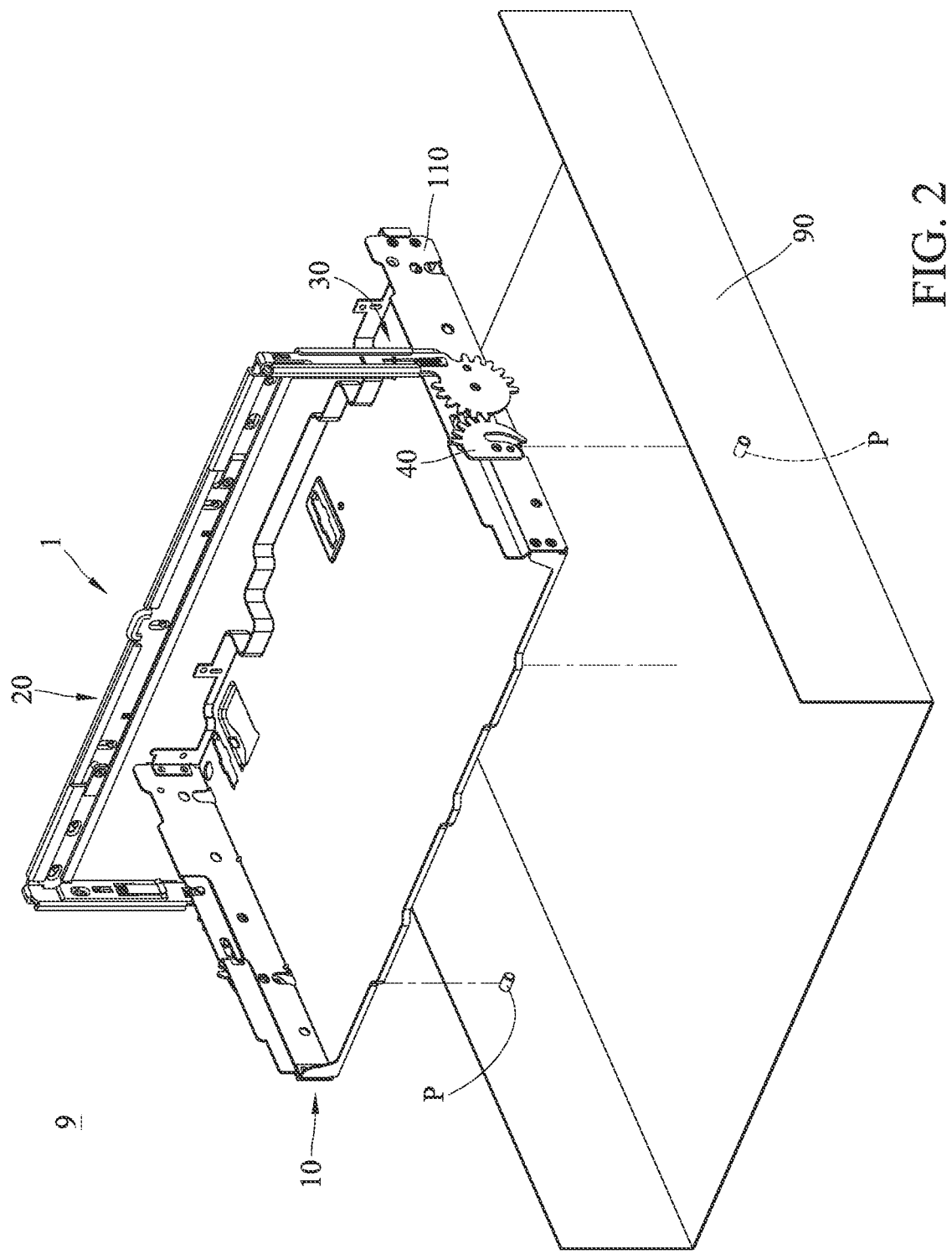
FIG. 2 is an exploded view of an electronic device and a casing assembly thereof according to one embodiment of the disclosure.

Firstly, referring to FIGS. 1-2, one embodiment of the disclosure provides an electronic device 9. The electronic device 9 may be, but is not limited to, a desktop computer, a server, or part of any one thereof, but the disclosure is not limited thereto. The electronic device 9 may include a chassis 90 and at least one casing assembly 1. The chassis 90 is configured to support or accommodate casing assembly 1. The chassis 90 may support any other associated components, elements, devices, or structures. Note that the chassis 90 and elements thereon are provided for better understanding of the casing assembly 1 but are not intended to limit the disclosure in any aspect.

The casing assembly 1 is detachably installed on the chassis 90. As shown, the casing assembly 1 may be placed into the chassis 90 or taken out of the chassis 90 along a predetermined direction as indicated by dashed lines in FIG. 2. The casing assembly 1 may include a carrier 10, a handle 20, at least one transmission mechanism 30, and at least one engagement component 40. The handle 20, the transmission mechanism 30, and the engagement component 40 are disposed on the carrier 10, and the carrier 10 is removably disposed on the chassis 90.

The handle 20 is handheldable and therefore allows user to operate and move the casing assembly 1. As shown, at least one end of the handle 20 is movably connected to the carrier 10 via the transmission mechanism 30 and is switchable a lying position (as shown in FIG. 1) and a standing position (as shown in FIG. 2) relative to the carrier 10. In this embodiment, the handle 20 is pivotable relative to the carrier 10 about an axis AX.

The transmission mechanism 30 is connected to the carrier 10 and the handle 20 and is configured to fix the handle 20 in specific positions. In one embodiment, the casing assembly 1 may include two transmission mechanisms 30 respectively arranged at two opposite ends of the handle 20. In other embodiments, only one end of the handle of the casing assembly is connected to the carrier via the transmission mechanism.

The engagement component 40 is disposed on the carrier 10. The engagement component 40 is movable by the transmission mechanism 30 and configured to be engaged with the chassis 90. As shown, there may be a post P protruding inward from an inner surface of at least one of side plates (not numbered) of the chassis 90, the engagement component 40 may be engaged with the post P by being moved by the handle 20 and the transmission mechanism 30. As the engagement component 40 is engaged with the post P, the casing assembly 1 is fixed on the chassis 90. The post P may be a protrusion fixed at and protruding inwards from the inner side of the chassis 90. In one embodiment, the post P may be a screw or bolt fixed at the inner surface of a side plate of the chassis 90.

Figure 3:
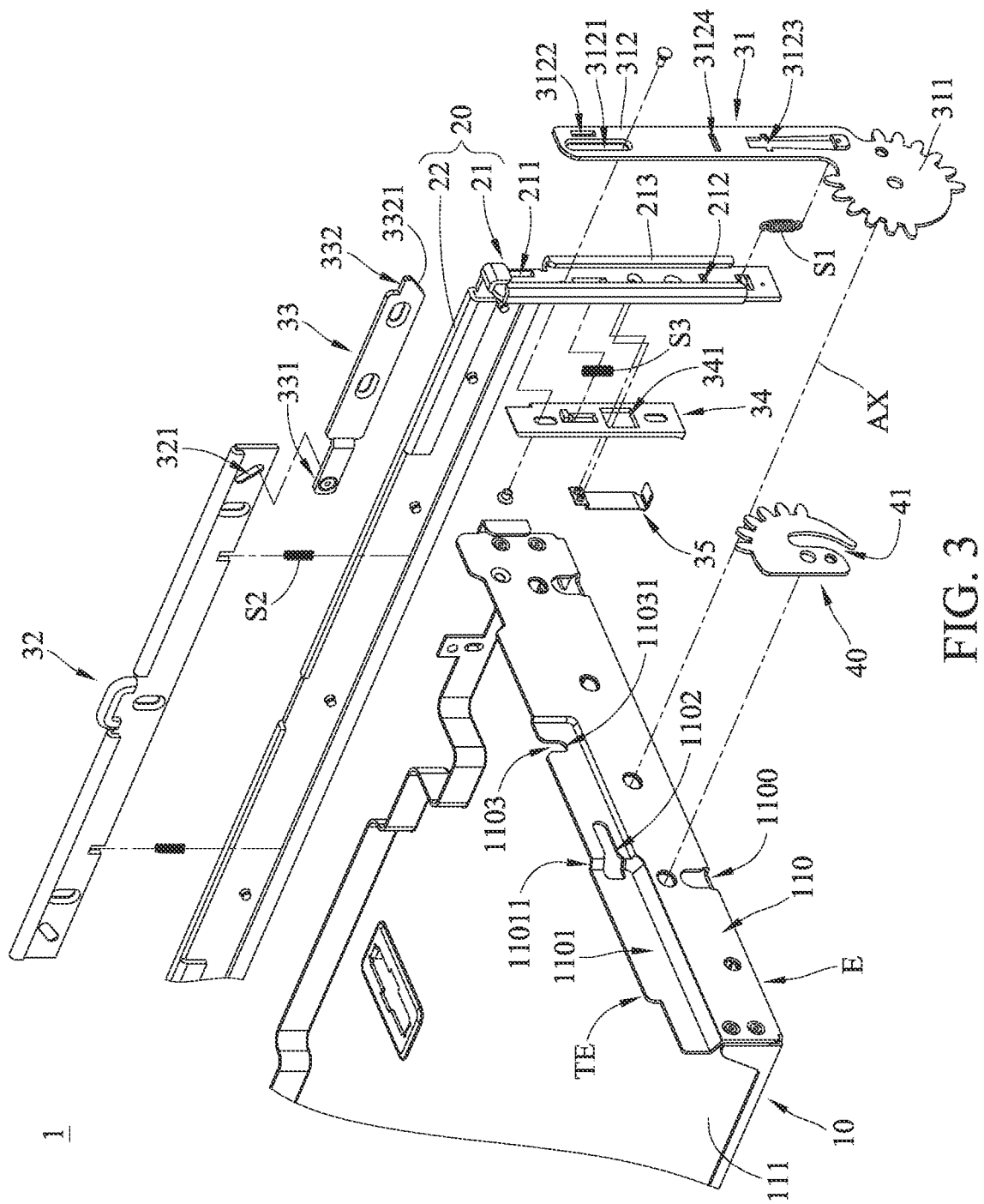
FIGS. 3-4 are exploded views of a casing assembly according to one embodiment of the disclosure.
Figure 4:
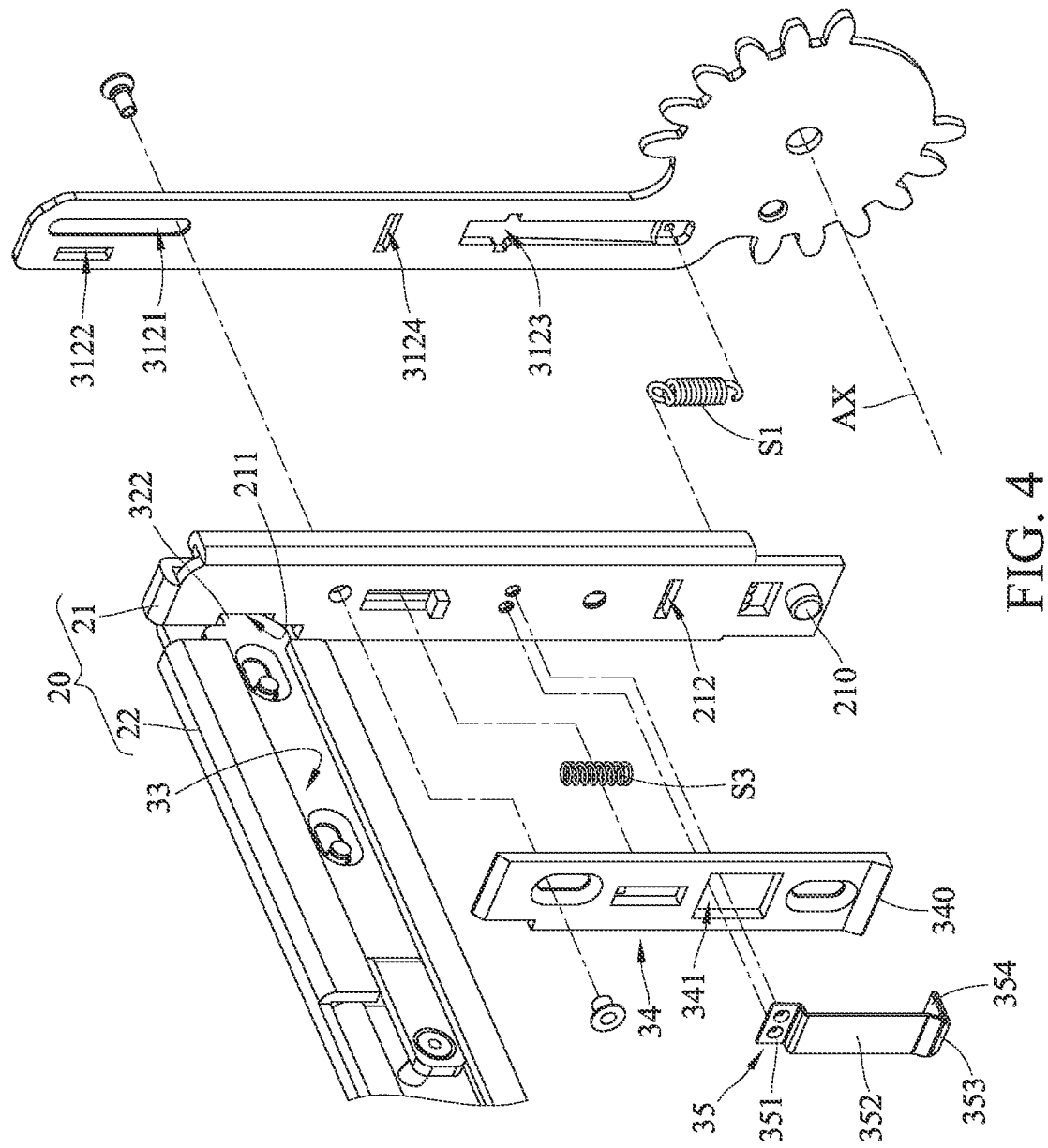
Figure 5:
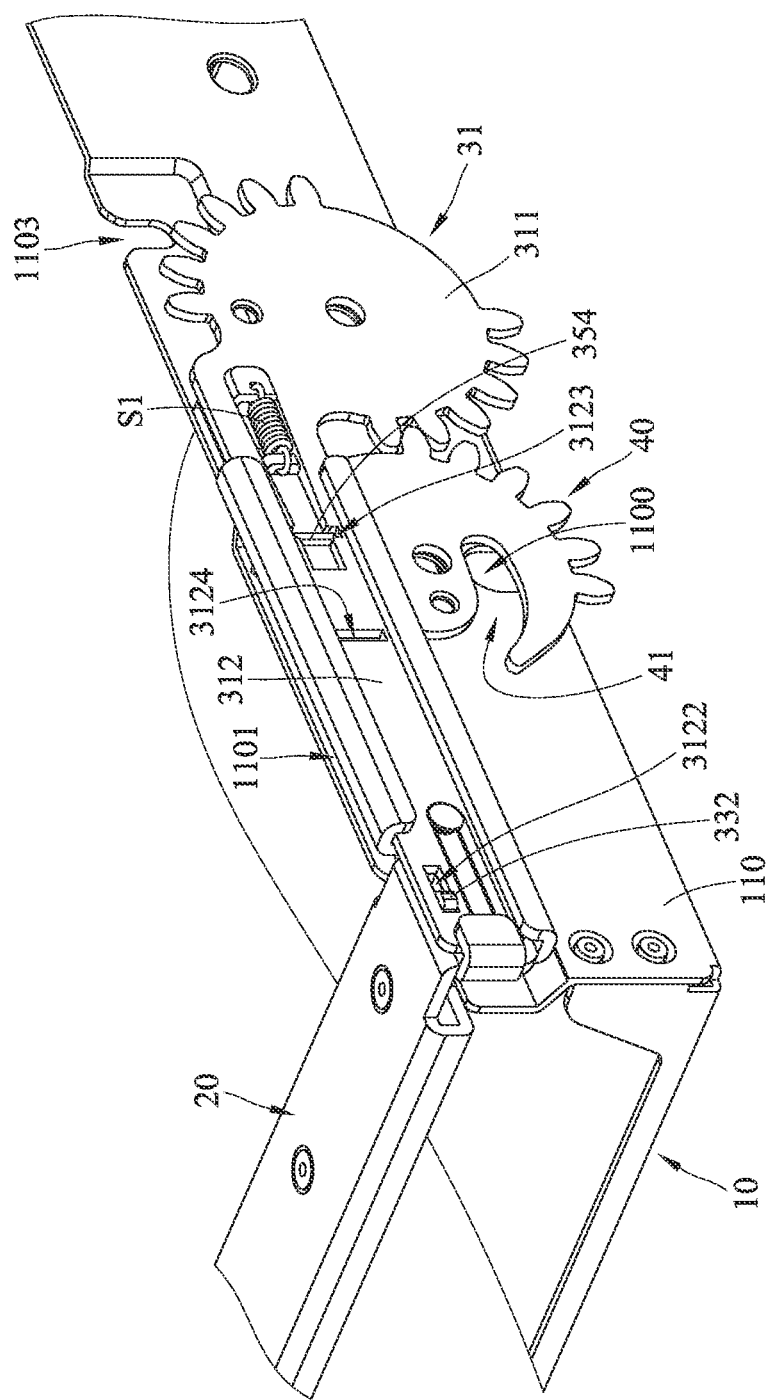
FIGS. 5-8 are partially enlarged perspective views of a casing assembly according to one embodiment of the disclosure.
Figure 6:
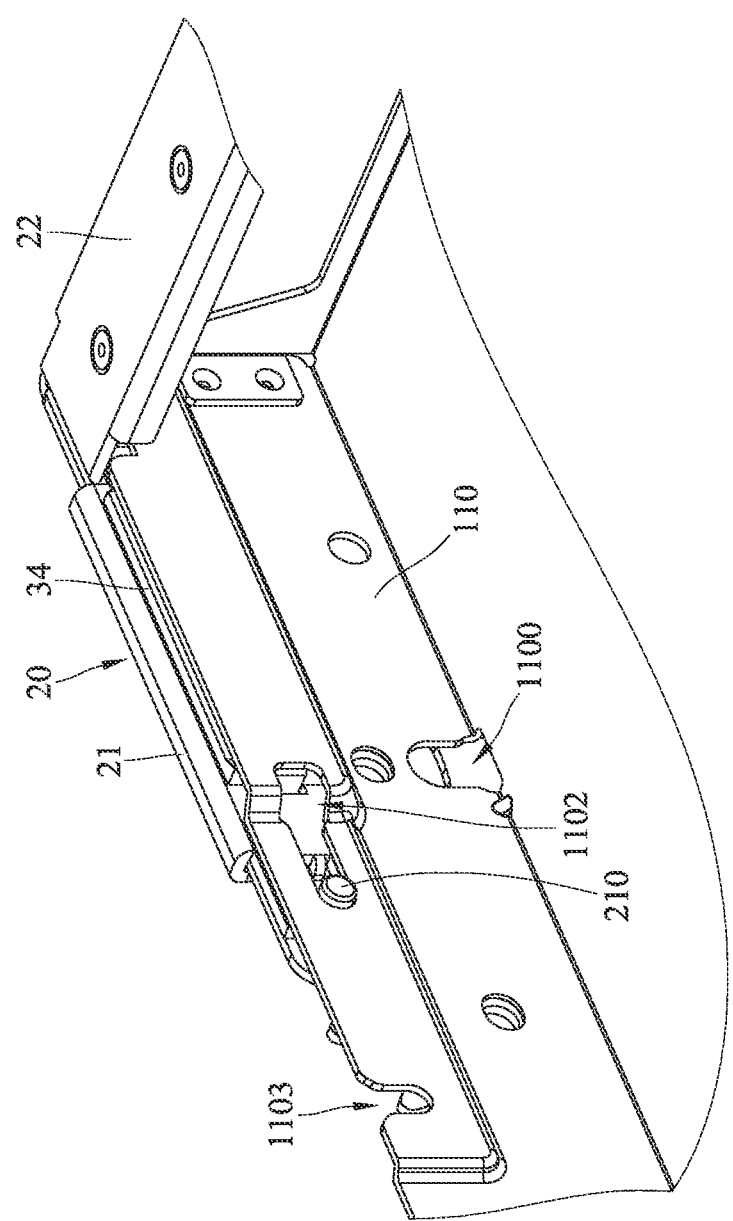
Figure 7:
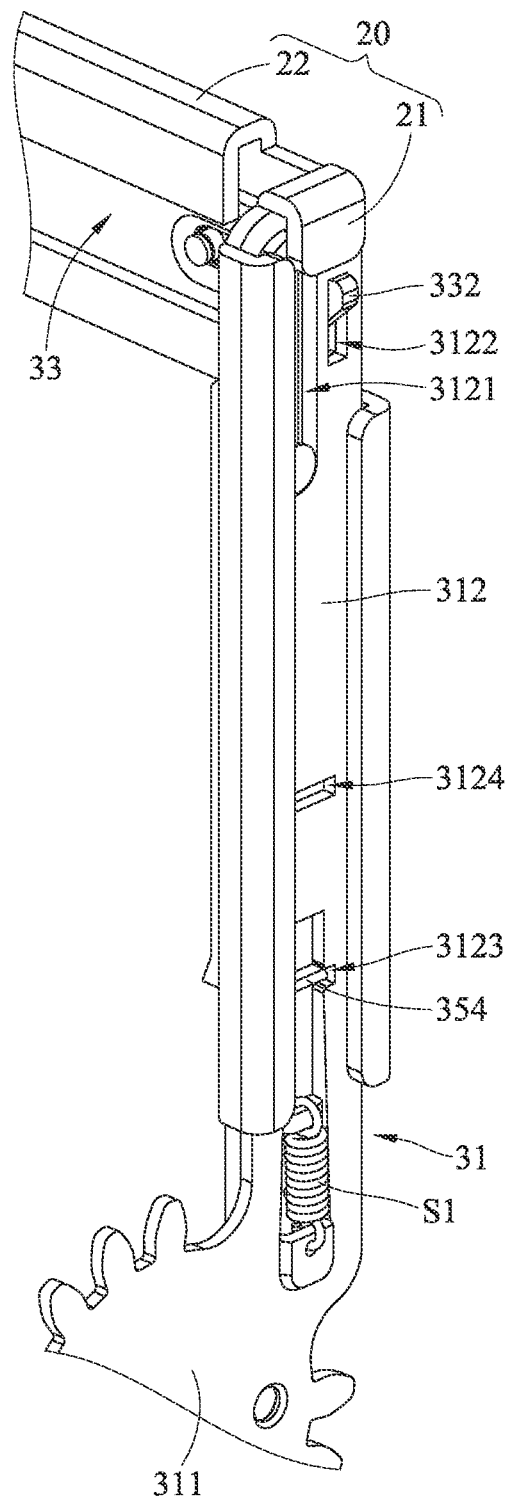

The details of the casing assembly 1 are given below with further reference to FIGS. 3-8, where FIGS. 3-4 are exploded views of the casing assembly 1 and FIGS. 5-8 are partially enlarged perspective views of the casing assembly 1.

The transmission mechanisms 30 at two opposite sides of the carrier 10 may have the same or similar configuration, thus only one side of the casing assembly 1 will be exemplarily described in detail in the following paragraphs.

As shown, the carrier 10 may include at least one side plate 110. The engagement component 40 is pivotally disposed on the outer side or outer surface of the side plate 110. The handle 20 may be pivotably connected to the outer side or outer surface of the side plate 110 via the transmission mechanism 30 and therefore the handle 20 is able to move the engagement component 40 via the transmission mechanism 30. Further, the side plate 110 may have at least one holding hole 1100, a recess portion 1101, an engagement groove 1102, and a positioning slot 1103.

The holding hole 1100 may be arranged at the lower portion of the side plate 110. In specific, the holding hole 1100 may be located at a joint edge E between the side plate 110 and the bottom plate 111. The post P on the chassis 90 may be disposed through the holding hole 1100 during the placement of the carrier 10 on the chassis 90. The recess portion 1101 may mean an inwardly recessed portion of the side plate 110 and is configured for avoiding interfering with specific structure on the handle 20. In specific, the recess portion 1101 may be arranged at a side of the side plate 110 located opposite to the bottom plate 111, thus at least part of a top edge TE of the side plate 110 has a contour having a step joining two straight lines not aligned with each other. As shown, there may be a step 11011 located within the recess portion 1101 or located at one end of the recess portion 1101. The step 11011 may mean a joint connecting between two portions of the recess portion 1101 which are in different depths from the outer surface of the side plate 110. In other words, the step 11011 may mean a structure within the recess portion 1101 which is connected between two surfaces not coplanar with each other.

At least part of the engagement groove 1102 may be located in the recess portion 1101 and across the step 11011; in other words, the engagement groove 1102 may have a contour crossing a plurality of surfaces not coplanar with one another. The engagement groove 1102 may extend in a direction substantially parallel to a joint edge E between the side plate 110 and the bottom plate 111; in a specific view angle, the engagement groove 1102 may be considered as a horizontally extending groove formed on the side plate 110. The positioning slot 1103 may be a slot extending towards the bottom plate 111 from the top edge TE of the side plate 110; in a specific view angle, the positioning slot 1103 may be considered as a vertically extending groove formed on the side plate 110.

The handle 20 may include at least one extension arm portion 21 and a bridge portion 22. The extension arm portion 21 is configured to be assembled with the transmission mechanism 30. There may be two extension arm portions 21 respectively arranged at two opposite sides of the carrier 10. The bridge portion 22 may be connected between the extension arm portions 21 and across two opposite sides of the carrier 10. The extension arm portion 21 and the bridge portion 22 may be integrally formed with each other or two pieces assembled with each other. At least one of the extension arm portions 21 may have an engagement element 210 thereon. In specific, the engagement element 210 may be arranged at the inner side of the extension arm portion 21; in other words, the engagement element 210 may be protruding inwards from a side of the extension arm portion 21 facing towards the side plate 110. The engagement element 210 may be selectively engaged with the engagement groove 1102 or the positioning slot 1103 by switching the handle 20 to the lying position or the standing position. In addition, the extension arm portion 21 of the handle 20 may further have a first through hole 211 and a second through hole 212 which are configured to interactive with components of the transmission mechanism 30 which will be introduced hereinafter.

In this embodiment, the transmission mechanism 30 may include a pivotable component 31, an activating component 32, a first latching component 33, a releasing component 34, and a second latching component 35. The pivotable component 31 may be a plate shape and may include a first portion 311 and a second portion 312 connected to each other. The first portion 311 is pivotably disposed on the side plate 110 of the carrier 10 about the axis AX. In specific, the axis AX of the first portion 311 may be displaced from a fixing end 11031 of the positioning slot 1103 on the side plate 110; in other words, the fixing end 11031 of the positioning slot 1103 may be not located at or may be spaced apart from the axis AX of the pivotable component 31. The fixing end 11031 means a closed end of the positioning slot 1103 located furthest away from the top edge TE of the side plate 110.

In addition, the first portion 311 is configured to be connected to and move the engagement component 40. For example, as shown, in this embodiment, the first portion 311 may be a gear, the engagement component 40 may be a gear suitable for being meshed with the first portion 311. Thus, when the first portion 311 is rotated relative to the carrier 10, the first portion 311 causes the engagement component 40 to rotate so as to cause a latching groove 41 of the engagement component 40 to engage with the post P of the chassis 90 or to disengage the latching groove 41 from the post P of the chassis 90.

The second portion 312 extends outwards from a side of the first portion 311 and is configured to be slidably disposed on the extension arm portion 21 of the handle 20. For example, the second portion 312 is slidably disposed on the outer surface of the extension arm portion 21. In specific, two opposite sides of the second portion 312 may be slidably embedded in rail structures 213 formed at two opposite edges of the extension arm portion 21. As such, the handle 20 is slidable relative to the carrier 10 since the handle 20 is slidably disposed on the carrier 10, and the handle 20 is rotatable relative to the carrier 10 since the first portion 311 is movably disposed on the carrier 10; in other words, the handle 20 is slidable and rotatable relative to the carrier 10 via the pivotable component 31. As shown, the handle 20 is rotatable about the first portion 311 of the pivotable component 31.

Optionally, to limit the slidable range of the extension arm portion 21 relative to the second portion 312. The second portion 312 may have a guide groove 3121 extending in a direction substantially parallel to the extension direction of the second portion 312. The second portion 312 is configured for an insertion of a suitable fastener (not numbered, e.g., a bolt or screw) fixed on the extension arm portion 21.

In addition, in this embodiment, there may be a first restoring component S1 connected between the second portion 312 and the extension arm portion 21 of the handle 20. The first restoring component S1 may be any suitable extension spring and therefore is capable of forcing the extension arm portion 21 to move towards the first portion 311 of the pivotable component 31 so as to force the handle 20 to move towards the carrier 10.

Further, the second portion 312 may further have a positioning hole 3122 located adjacent to the bridge portion 22 of the handle 20, the positioning hole 3122 is configured to engage with the first latching component 33. Further, the second portion 312 may further have a first holding hole 3123 and a second holding hole 3124, the first holding hole 3123 and the second holding hole 3124 are arranged between the first portion 311 and the positioning hole 3122 and spaced apart from each other by a specific distance.

While the handle 20 is switching positions, the second through hole 212 on the extension arm portion 21 of the handle 20 is selectively aligned with the first holding hole 3123 or the second holding hole 3124 to interact with the second latching component 35.

The activating component 32 is movably disposed on the bridge portion 22 of the handle 20 and is configured for user to active the transmission mechanism 30. In specific, the activating component 32 may be in a plate shape and stacked on the bridge portion 22 of the handle 20. The activating component 32 is slidable and movable in a direction substantially perpendicular to the extension direction of the bridge portion 22. Also, at least part of the activating component 32 sticking out of an edge of the bridge portion 22 and configured for user to press the activating component 32. In addition, there may be one or more second restoring components S2 connected between the pivotable component 31 and the bridge portion 22. The second restoring component S2 may be any suitable compression spring and is configured to keep part of the activating component 32 sticking out of the edge of the bridge portion 22 and to restore the position of the activating component 32.

The first latching component 33 is movably disposed on the bridge portion 22 of the handle 20 and in contact with an end of the activating component 32, thus the first latching component 33 can be moved by the activating component 32. In specific, the first latching component 33 may be in a plate shape and stacked on the bridge portion 22, and the first latching component 33 is arranged between the activating component 32 and the extension arm portion 21 of the handle 20. The activating component 32 may include at least one connecting portion 321, the connecting portion 321 may be an inclined slot at an angle to the extension direction of the bridge portion 22. The first latching component 33 may include a connecting portion 331, the connecting portion 331 is arranged at an end of the first latching component 33 and configured to be slidably disposed through the connecting portion 321 of the activating component 32. As such, when the activating component 32 is moved in a direction substantially perpendicular to the extension direction of the bridge portion 22, the cooperation of the connecting portion 321 and the connecting portion 331 causes the motion of the activating component 32 to move the first latching component 33 in a direction substantially parallel to the extension direction of the bridge portion 22, thus the first latching component 33 is movable towards or away from the extension arm portion 21 of the handle 20. The first latching component 33 may further have an insertion portion 332. The insertion portion 332 may be a structure located at an end of the first latching component 33 located opposite to the activating component 32 and tapered outwards. As shown, the insertion portion 332 is configured to be selectively inserted into the first through hole 211 of the extension arm portion 21.

Figure 8:
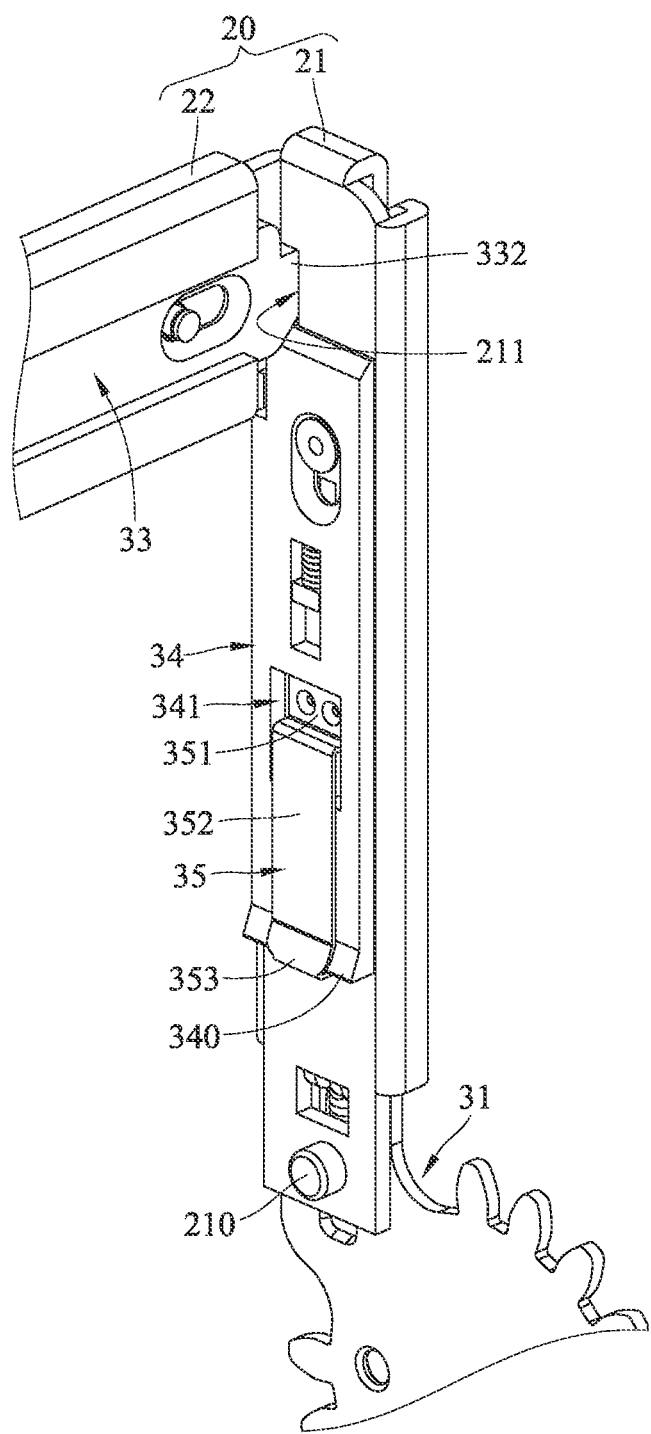
Figure 11:
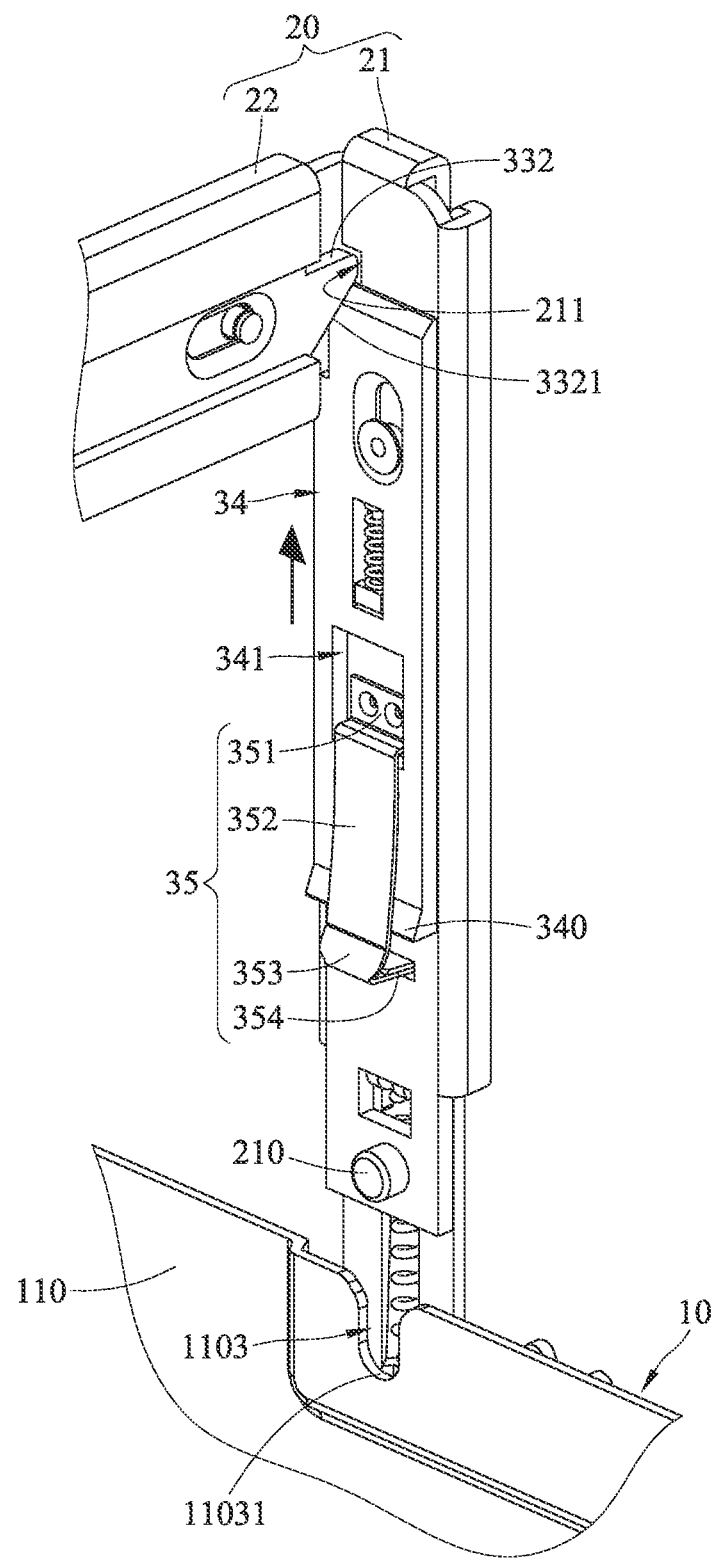

The releasing component 34 is configured to be slidably disposed on the extension arm portion 21 of the handle 20 and switchable between a first position (as shown in FIG. 8) and a second position (as shown in FIG. 11). For example, the releasing component 34 is slidably disposed on the extension arm portion 21 of the handle 20; in other words, the releasing component 34 and the second portion 312 of the pivotable component 31 are respectively slidably disposed on two opposite surfaces of the extension arm portion 21 of the handle 20. In specific, the releasing component 34 is disposed on the extension arm portion 21 and movable along a direction substantially parallel to the extension direction of the extension arm portion 21. In this embodiment, there may be a third restoring component S3 connected between the releasing component 34 and the extension arm portion 21 of the handle 20. The third restoring component S3 may be any suitable extension spring and is configured to cause the releasing component 34 to move towards the bridge portion 22 of the handle 20 or towards the insertion portion 332 of the first latching component 33 (i.e., the second position). Optionally, the insertion portion 332 of the first latching component 33 may be constantly in contact with the end of the releasing component 34 located close to the bridge portion 22 of the handle 20. The insertion portion 332 may have an inclined surface 3321 configured to contact and push the end of the releasing component 34 located close to the bridge portion 22 of the handle 20. During the insertion of the insertion portion 332 into the first through hole 211 of the extension arm portion 21, the inclined surface 3321 of the insertion portion 332 causes the releasing component 34 to move away from the bridge portion 22 so as to move towards the first position. On the contrary, during the removal of the insertion portion 332 from the first through hole 211 of the extension arm portion 21, the third restoring component S3 forces the releasing component 34 to move towards the bridge portion 22 so as to move the releasing component 34 back to the second position.

Part of the second latching component 35 is disposed through the releasing component 34 and engaged with the extension arm portion 21. In detail, the second latching component 35 may be made of any suitable plastic or metal and may include a fixed portion 351, an elastic arm portion 352, a mating portion 353, and a latching portion 354; the releasing component 34 may have a convex portion 340 and a mount hole 341. The fixed portion 351 is located at an end of the second latching component 35 and is disposed through the mount hole 341 of the releasing component 34 and fixed to the extension arm portion 21. Thus, the position switching of the releasing component 34 does not affect the connection between the fixed portion 351 and the extension arm portion 21. The elastic arm portion 352 is connected between the fixed portion 351 and the mating portion 353 and is located at a side of the releasing component 34 located opposite to the extension arm portion 21.

The mating portion 353 is shaped to mating the convex portion 340. In specific, the convex portion 340 may be a protrusion located at an end of the releasing component 34 located opposite to the bridge portion 22 and located opposite to the extension arm portion 21. When the releasing component 34 is in the first position, the convex portion 340 is located in a space defined by the mating portion 353. When the releasing component 34 is moved towards the second position, the convex portion 340 is able to leave the mating portion 353 so as to cause the elastic arm portion 352 to deform and therefore force part of the elastic arm portion 352 to move away from the extension arm portion 21.

The latching portion 354 may be connected to the elastic arm portion 352 via the mating portion 353. When there is no external force applied on the second latching component 35, the latching portion 354 may be substantially perpendicular to the elastic arm portion 352 and is movably located at an end of the releasing component 34 located opposite to the bridge portion 22; in other words, the latching portion 354 is movably located at a side of the convex portion 340. In this arrangement, the latching portion 354 is able to across the releasing component 34 so as to be removably disposed through the second through hole 212 on the extension arm portion 21. Also, the latching portion 354 is selectively inserted into the first holding hole 3123 or the second holding hole 3124 of the second portion 312 at the other side of the extension arm portion 21 when responding to how the convex portion 340 of the releasing component 34 acts on the elastic arm portion 352.

Figure 9:
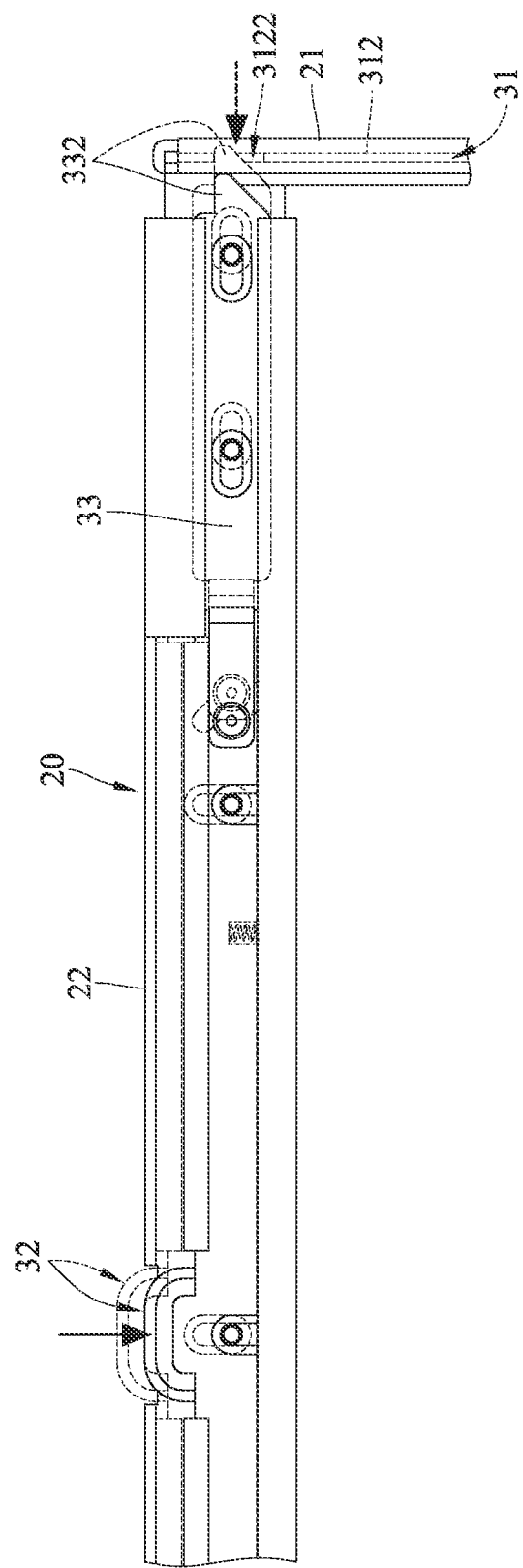
FIGS. 9-15 illustrate the operation of a casing assembly according to one embodiment of the disclosure.

Then, the operation of the casing assembly 1 will be introduced with further reference to FIGS. 1 and 9-15. Firstly, to take the casing assembly 1 out of the chassis 90, first step may be to switch the handle 20 to the standing position. To do so, as shown in FIG. 9, the part of the activating component 32 sticking out of the bridge portion 22 of the handle 20 is pushed as indicated by the arrow, such that the activating component 32 can cause the insertion portion 332 of the first latching component 33 to move away from the positioning hole 3122 of the pivotable component 31. In other words, the limitation that the first latching component 33 acts on the pivotable component 31 and the handle 20 can be canceled by pushing the activating component 32.

Figure 10:
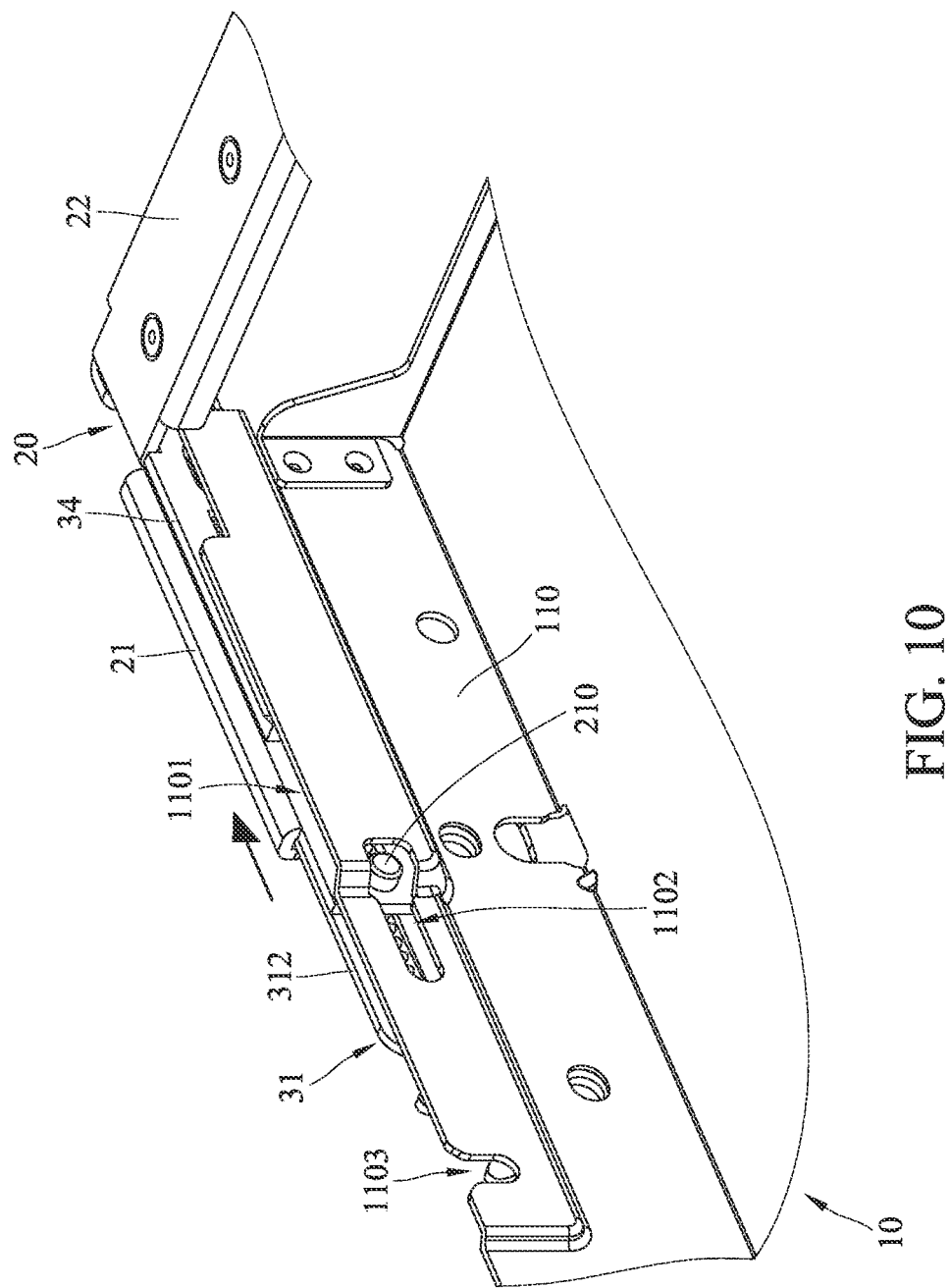

Then, in FIG. 10, the extension arm portion 21 of the handle 20 can be slid relative to the second portion 312 of the pivotable component 31 (as indicated by the arrow). During the movement, the engagement element 210 on the extension arm portion 21 is moved towards the recess portion 1101 along the engagement groove 1102 of the side plate 110 and therefore leaves the engagement groove 1102. In other words, the outward pulling of the handle 20 relative to the carrier 10 can release the engagement element 210 from the engagement groove 1102. On the contrary, when the handle 20 is in the lying position and not yet pulled outward, the engagement element 210 of the handle 20 is limited by the engagement groove 1102 so that the handle 20 is unable to rotate relative to the carrier 10. It is understandable that the engagement groove 1102 is able to keep the handle 20 in the lying position before the handle 20 is pulled outward, thereby preventing user from directly rotating the handle 20 in the laying position.

Figure 12:
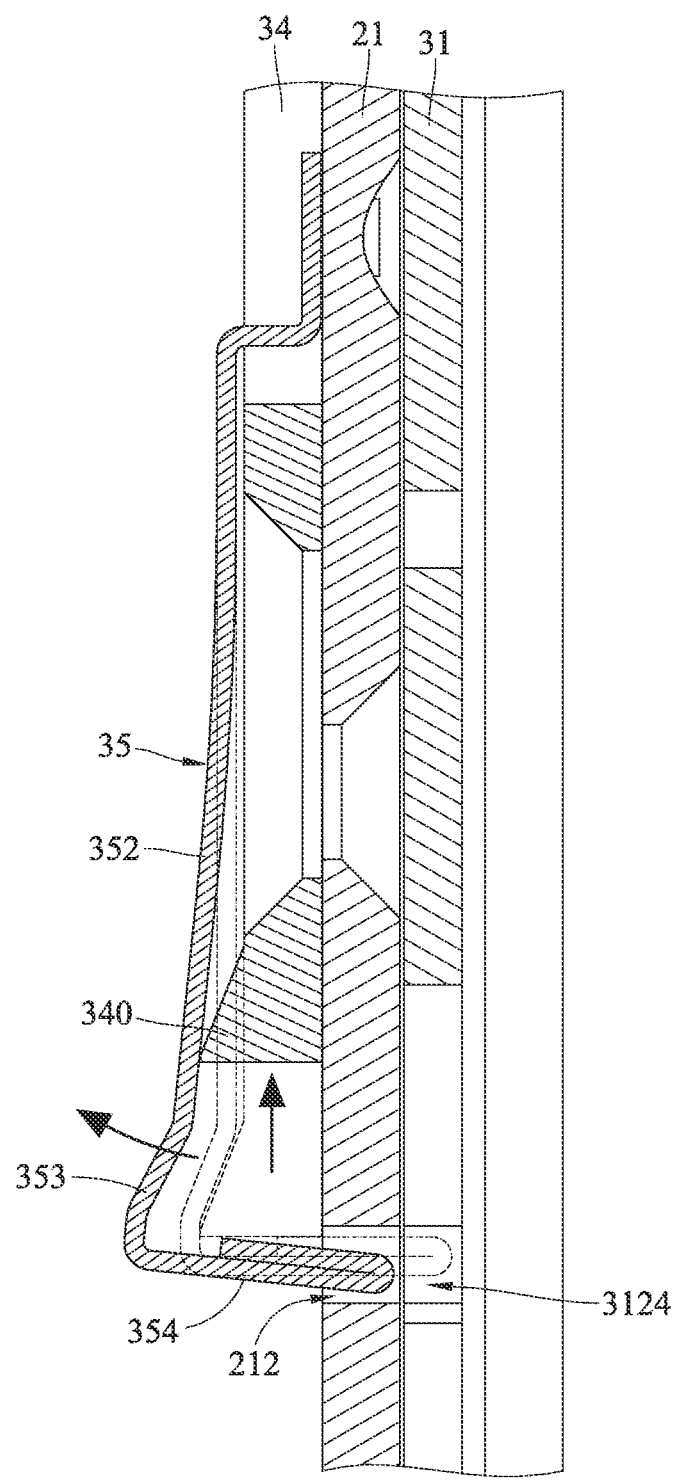
Figure 13:
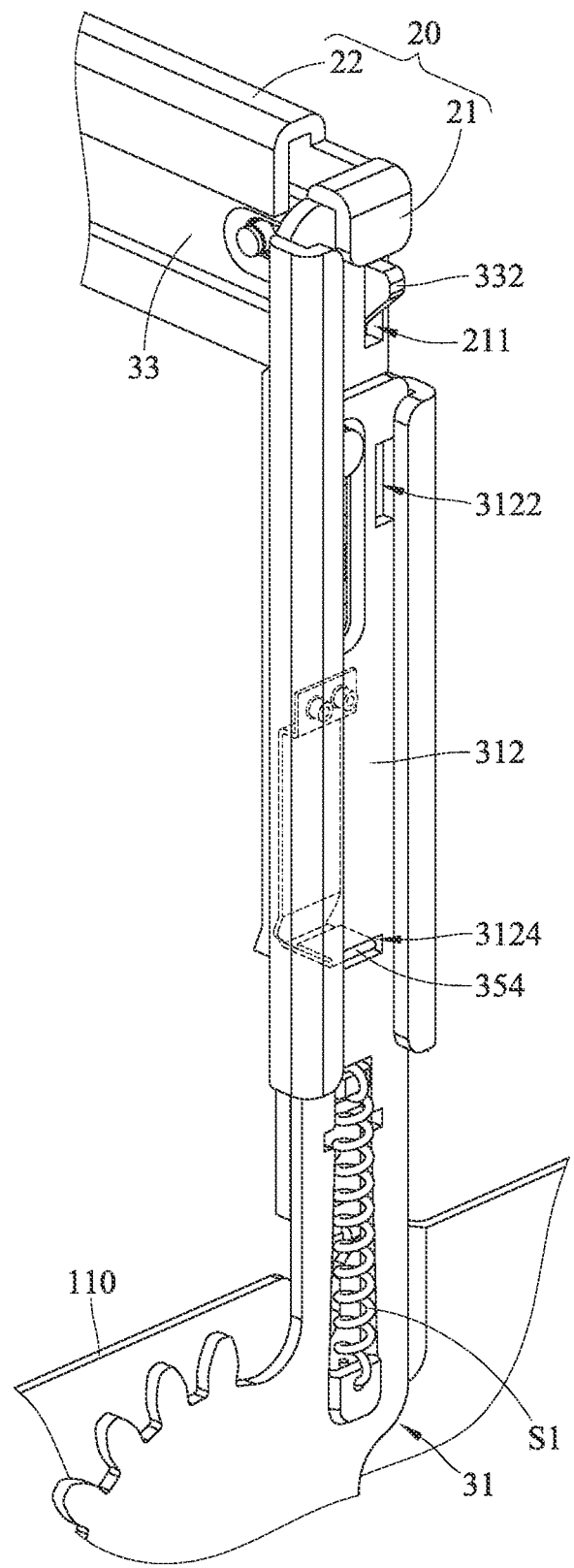
Figure 14:
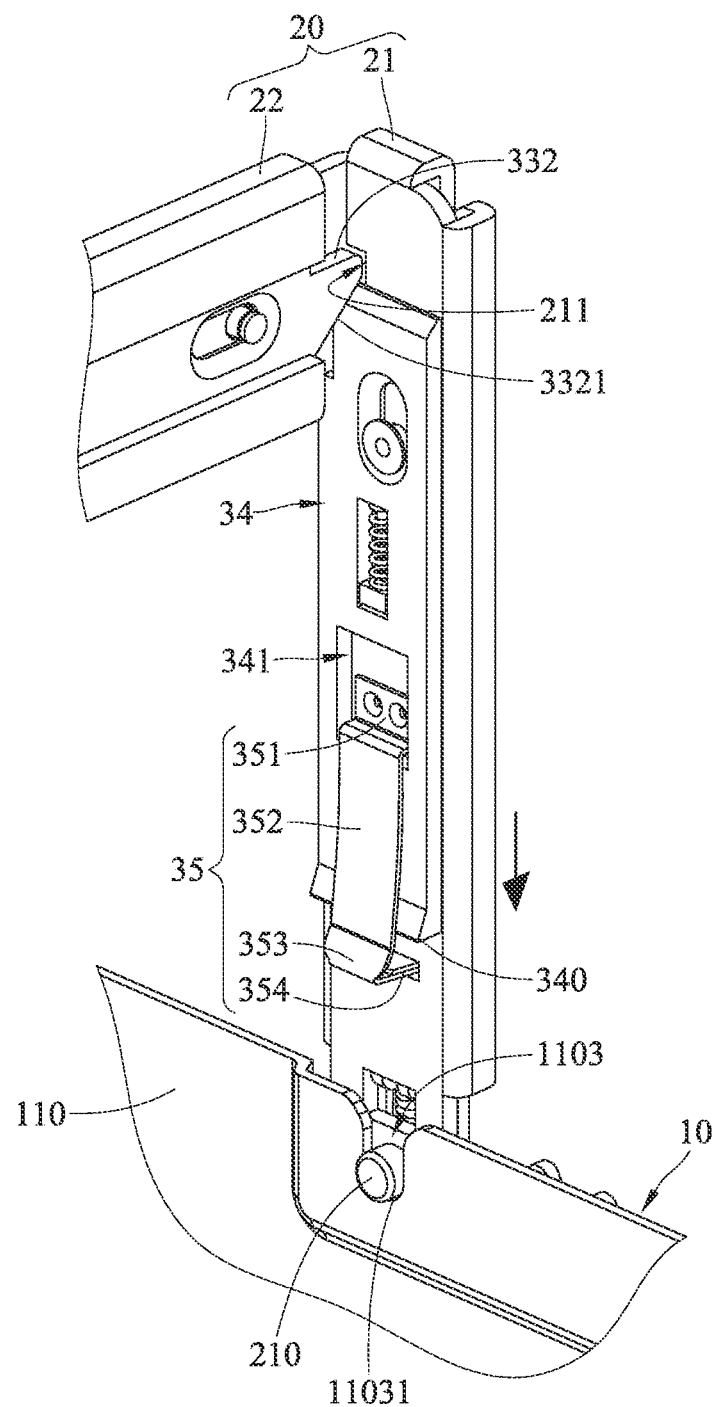
Figure 15:
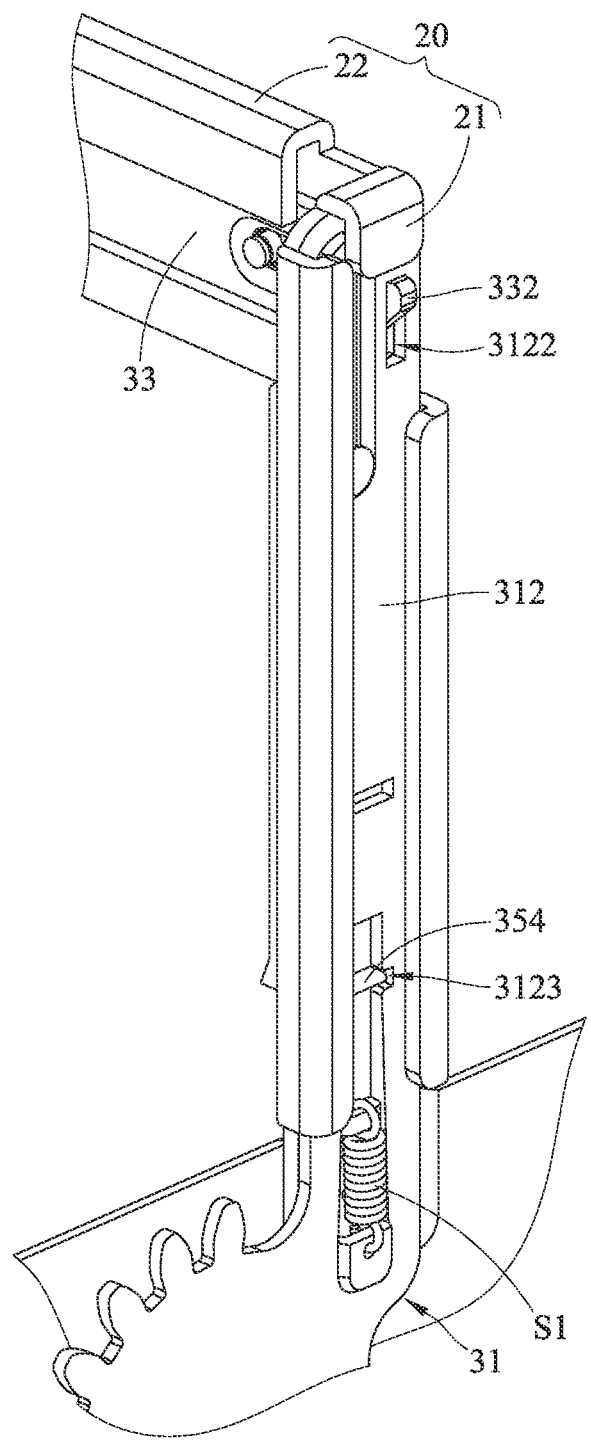

Then, in FIGS. 11-12, the handle 20 is pivoted to the standing position. Before the user releases the pivotable component 31, the insertion portion 332 of the first latching component 33 is kept in a position away from the first through hole 211 of the extension arm portion 21, thus the releasing component 34 can move the releasing component 34 towards the second position, such that the convex portion 340 of the releasing component 34 pushes the elastic arm portion 352 of the second latching component 35 so as to cause at least part of the elastic arm portion 352 to move away from the extension arm portion 21. This causes the latching portion 354 to disengage from the second holding hole 3124 of the pivotable component 31, thereby allowing the handle 20 to become slidable relative to the pivotable component 31.

Then, the user can release the activating component 32 to secure the position of the handle 20 relative to the pivotable component 31. In specific, the second restoring component S2 can restore the position of the activating component 32 and thereby causing the first latching component 33 to move towards the extension arm portion 21 of the handle 20, such that the insertion portion 332 of the first latching component 33 penetrates through the first through hole 211 on the extension arm portion 21. Meanwhile, the inclined surface 3321 of the insertion portion 332 causes the releasing component 34 to move away from the bridge portion 22 so that the releasing component 34 is moved back to the first position. When the releasing component 34 reaches the first position, the convex portion 340 of the releasing component 34 is located in the space defined by the mating portion 353 of the second latching component 35, allowing the elastic arm portion 352 to restore to its original shape and thereby making the latching portion 354 penetrate through the second through hole 212 of the extension arm portion 21 and the second holding hole 3124 of the pivotable component 31. By doing so, the handle 20 is engaged with the second portion 312 of the pivotable component 31 via the second latching component 35 fixed thereon, thus the relationship between the handle 20 and the pivotable component 31 is secured. As discussed, simple steps, such as rotating and then releasing the handle 20 can enable that the transmission mechanism 30 secures the position of the handle 20 to the pivotable component 31.

When the user pushes the activating component 32 again, the insertion portion 332 of the first latching component 33 will release the releasing component 34 and let the releasing component 34 go back to the second position and thereby making the convex portion 340 deform the elastic arm portion 352. This action will disengage the latching portion 354 from the second holding hole 3124 of the pivotable component 31 so that the handle 20 becomes slidable relative to the pivotable component 31. When the handle 20 is slidable relative to the pivotable component 31, the handle 20 can be pushed towards the carrier 10 (as indicated by arrows in FIG. 14) so as to place the engagement element 210 into the positioning slot 1103 of the side plate 110.

The user can release the activating component 32 when the engagement element 210 reaches the fixing end 11031 of the positioning slot 1103. By doing so, the activating component 32 causes the insertion portion 332 to penetrate through the first through hole 211 of the extension arm portion 21, and in FIG. 15, the insertion portion 332 can penetrate through the positioning hole 3122 on the second portion 312 of the pivotable component 31. Thus, the relationship between the handle 20 and the pivotable component 31 is secured by the first latching component 33. Meanwhile, releasing the activating component 32 can also return the releasing component 34 back to the first position, which allows the second latching component 35 to restore to its original shape and therefore makes the latching portion 354 penetrate through the second through hole 212 of the extension arm portion 21 and the first holding hole 3123 of the pivotable component 31, thereby securing the relationship between the handle 20 and the pivotable component 31.

As discussed, simple steps, such as switching the handle 20 to the standing position and then moving the handle 20 towards the carrier 10, can enable that the transmission mechanism 30 secures the position of the handle 20 to the carrier 10. Since the handle 20 is rotatable about the first portion 311 of the pivotable component 31 which is displaced from the fixing end 11031 of the positioning slot 1103, the positioning slot 1103 is able to effectively prevent the handle 20 from rotating as the engagement element 210, thereby preventing the carrier 10 from swinging relative to the handle 20 while user holding the handle 20.

According to the casing assembly and the electronic devices discussed in the above embodiments of the disclosure, the handle is rotatable about the pivotable component which is displaced from the fixing end of the positioning slot on the carrier, and the engagement element on the handle is removably located in the positioning slot, thus, when the engagement element of the handle is in the positioning slot, the positioning slot is able to effectively prevent the handle from rotating and therefore prevents the carrier from swinging relative to the handle while user holding the handle.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A casing assembly, comprising:
a carrier having a positioning slot with a fixing end;
a pivotable component pivotably disposed on the carrier; and
a handle slidably disposed on the pivotable component and pivotably connected to the carrier via the pivotable component;
wherein the handle has an engagement element, the engagement element is selectively inserted into the positioning slot and engaged with the fixing end.

2. The casing assembly according to claim 1, wherein the pivotable component comprises a first portion and a second portion connected to each other, the second portion is pivotably disposed on the carrier via the first portion, the handle is slidably disposed on the second portion so that the engagement element is movable close to or away from the first portion.

3. The casing assembly according to claim 2, further comprising an activating component and a first latching component, wherein the handle comprises an extension arm portion and a bridge portion connected to each other, the bridge portion is slidably disposed on the second portion of the pivotable component via the extension arm portion, the activating component and the first latching component are movably disposed on the bridge portion, the first latching component is movable by the activating component, the extension arm portion has a first through hole, the first latching component has an insertion portion, the second portion has a positioning hole, when the extension arm portion is moved towards the carrier along the second portion to overlap the positioning hole with the first through hole, the insertion portion is removably disposed through the first through hole and the positioning hole.

4. The casing assembly according to claim 3, further comprising a restoring component connected between the activating component and the bridge portion to force the activating component to cause the insertion portion of the first latching component to insert into the first through hole.

5. The casing assembly according to claim 3, further comprising a second latching component comprising a fixed portion and a latching portion, the fixed portion is fixed at a side of the extension arm portion located opposite to the second portion, the latching portion is removably disposed through a second through hole of the extension arm portion, the second portion further has a first holding hole and a second holding hole for an insertion of the latching portion, the second through hole of the extension arm portion is selectively corresponding to the first holding hole or the second holding hole when the extension arm portion is towards or away from the carrier along the second portion.

6. The casing assembly according to claim 5, further comprising a releasing component slidably disposed on a side of the extension arm portion located opposite to the second portion and having a first position and a second position, wherein the releasing component has a convex portion protruding outwards from a side of the releasing component located opposite to the extension arm portion, the second latching component comprises an elastic arm portion and a mating portion, the elastic arm portion is connected between the fixed portion and the mating portion and located at the side of the releasing component located opposite to the extension arm portion, the mating portion is connected between the elastic arm portion and the latching portion and is shaped to mating the convex portion; when the releasing component is in the first position, the convex portion is located at the mating portion and the latching portion penetrates through the second through hole and one of the first holding hole and the second holding hole selectively; when the releasing component is moved towards the second position, the elastic arm portion is pushed by the convex portion and the latching portion is disengaged from the first holding hole or the second holding hole selectively.

7. The casing assembly according to claim 6, further comprising a restoring component connected between the releasing component and the extension arm portion, wherein the insertion portion of the first latching component has an inclined surface contacting the releasing component and keeping the releasing component in the first position; when the activating component is forced to cause the insertion portion of the first latching component to disengage from the first through hole of the extension arm portion, the restoring component causes the releasing component to move towards the second position.

8. The casing assembly according to claim 1, further comprising a restoring component connected between the handle and the pivotable component.

9. The casing assembly according to claim 1, wherein the carrier comprises a side plate and a bottom plate connected to the side plate, the side plate has the positioning slot, the pivotable component is pivotably disposed on the side plate, the positioning slot extends from an edge of the side plate.

10. The casing assembly according to claim 9, wherein the side plate further has a recess portion and an engagement groove, the engagement groove extends along a joint edge between the side plate and the bottom plate and across a step at an end of the recess portion, the handle is switchable between a lying position and a standing position relative to the side plate via the pivotable component; when the handle is in the standing position, the engagement element of the handle corresponds to the positioning slot of the side plate; when the handle is in the lying position, the engagement element of the handle corresponds to the step of the recess portion and is located at the recess portion or removably engaged with the engagement groove selectively.

11. An electronic device, comprising:
a chassis; and
a casing assembly comprising:
a carrier removably disposed on the chassis, wherein the carrier has a positioning slot having a fixing end;
a pivotable component pivotably disposed on the carrier; and
a handle slidably disposed on the pivotable component and pivotably connected to the carrier via the pivotable component;
wherein the handle has an engagement element selectively inserted into the positioning slot and engaged with the fixing end.

12. The electronic device according to claim 11, wherein the pivotable component comprises a first portion and a second portion connected to each other, the second portion is pivotably disposed on the carrier via the first portion, the handle is slidably disposed on the second portion so that the engagement element is movable close to or away from the first portion.

13. The electronic device according to claim 12, wherein the casing assembly further comprises an activating component and a first latching component, the handle comprises an extension arm portion and a bridge portion connected to each other, the bridge portion is slidably disposed on the second portion of the pivotable component via the extension arm portion, the activating component and the first latching component are movably disposed on the bridge portion, the first latching component is movable by the activating component, the extension arm portion has a first through hole, the first latching component has an insertion portion, the second portion has a positioning hole, when the extension arm portion is moved towards the carrier along the second portion to overlap the positioning hole with the first through hole, the insertion portion is removably disposed through the first through hole and the positioning hole.

14. The electronic device according to claim 13, wherein the casing assembly further comprises a restoring component connected between the activating component and the bridge portion to force the activating component to cause the insertion portion of the first latching component to insert into the first through hole.

15. The electronic device according to claim 13, wherein the casing assembly further comprises a second latching component comprising a fixed portion and a latching portion, the fixed portion is fixed at a side of the extension arm portion located opposite to the second portion, the latching portion is removably disposed through a second through hole of the extension arm portion, the second portion further has a first holding hole and a second holding hole for an insertion of the latching portion, the second through hole of the extension arm portion is selectively corresponding to one of the first holding hole and the second holding hole when the extension arm portion is towards or away from the carrier along the second portion.

16. The electronic device according to claim 15, wherein the casing assembly further comprises a releasing component slidably disposed on a side of the extension arm portion located opposite to the second portion and having a first position and a second position, the releasing component has a convex portion protruding outwards from a side of the releasing component located opposite to the extension arm portion, the second latching component comprises an elastic arm portion and a mating portion, the elastic arm portion is connected between the fixed portion and the mating portion and located at the side of the releasing component located opposite to the extension arm portion, the mating portion is connected between the elastic arm portion and the latching portion and is shaped to mating the convex portion; when the releasing component is in the first position, the convex portion is located at the mating portion and the latching portion penetrates through the second through hole and one of the first holding hole and the second holding hole selectively; when the releasing component is moved towards the second position, the elastic arm portion is pushed by the convex portion and the latching portion is disengaged from the first holding hole or the second holding hole selectively.

17. The electronic device according to claim 16, wherein the casing assembly further comprises a restoring component connected between the releasing component and the extension arm portion, the insertion portion of the first latching component has an inclined surface contacting the releasing component and keeping the releasing component in the first position; when the activating component is forced to cause the insertion portion of the first latching component to disengage from the first through hole of the extension arm portion, the restoring component causes the releasing component to move towards the second position.

18. The electronic device according to claim 11, wherein the casing assembly further comprises a restoring component connected between the handle and the pivotable component.

19. The electronic device according to claim 11, wherein the carrier comprises a side plate and a bottom plate connected to the side plate, the side plate has the positioning slot, the pivotable component is pivotably disposed on the side plate, the positioning slot extends from an edge of the side plate.

20. The electronic device according to claim 19, wherein the side plate further has a recess portion and an engagement groove, the engagement groove extends along a joint edge between the side plate and the bottom plate and across a step at an end of the recess portion, the handle is switchable between a lying position and a standing position relative to the side plate via the pivotable component; when the handle is in the standing position, the engagement element of the handle corresponds to the positioning slot of the side plate; when the handle is in the lying position, the engagement element of the handle corresponds to the step of the recess portion and is located at the recess portion or removably engaged with the engagement groove selectively.

* * * * *